United States Patent [19]

Hokke

[11] Patent Number: 5,091,651
[45] Date of Patent: Feb. 25, 1992

[54] OBJECT HOLDER FOR SUPPORTING AN OBJECT IN A CHARGED PARTICLE BEAM SYSTEM

[75] Inventor: Robin Hokke, Eindhoven, Netherlands

[73] Assignee: U.S. Philips Corp., New York, N.Y.

[21] Appl. No.: 600,460

[22] Filed: Oct. 19, 1990

[30] Foreign Application Priority Data

Nov. 6, 1989 [NL] Netherlands .................. 8902727

[51] Int. Cl.[5] .............................................. H01J 37/20
[52] U.S. Cl. ............................. 250/443.1; 250/442.11; 250/440.11
[58] Field of Search ............ 250/443.1, 440.1, 442.1, 250/310, 311

[56] References Cited

U.S. PATENT DOCUMENTS

| | | | |
|---|---|---|---|
| 3,151,241 | 9/1964 | Hermann et al. | 250/443.1 |
| 3,624,390 | 11/1971 | Watanabe | 250/310 |
| 3,896,314 | 7/1975 | Nukui et al. | 250/443.1 |
| 4,034,220 | 7/1977 | Le Ceressus et al. | 250/310 |
| 4,162,401 | 7/1979 | King et al. | 250/443.1 |
| 4,219,731 | 8/1980 | Migitaka et al. | 250/310 |
| 4,996,433 | 2/1991 | Jones et al. | 250/443.1 |

Primary Examiner—Jack I. Berman
Assistant Examiner—Kiet T. Nguyen
Attorney, Agent, or Firm—William L. Botjer

[57] ABSTRACT

In an object holder which is intended for use in a charged particle beam system and which comprises a heating element there is provided an object carrier which cooperates with the heating element and which comprises an electrically insulating member having a supporting face and an aperture which reaches as far as the supporting face and which serves for the transmission of a charged particle beam, at least two current-conductive portions being connected to said insulating member, said contact portions contacting the object when the object is arranged on the supporting face. An object carrier of this kind enables electromigration studies in the object at high temperatures by application of a current through the object via the contact portions.

6 Claims, 1 Drawing Sheet

1

OBJECT HOLDER FOR SUPPORTING AN OBJECT IN A CHARGED PARTICLE BEAM SYSTEM

BACKGROUND OF THE INVENTION

The invention relates to an object holder which serves to support an object in a charged particle beam system and which comprises a heating element.

The invention also relates to an object carrier suitable for use in such an object holder.

An object holder of the kind set forth is known from U. Valdre "General considerations on specimen stages", Proc. Fifth European Congress on Electron Microscopy, 1972; pp. 317-321.

The cited article describes object holders which are suitable for heating an object in a transmission electron microscope (TEM), a scanning electron microscope (SEM) or a scanning transmission electron microscope (STEM) by means of, for example a rotationally symmetrical furnace provided with a heating coil. Heating of an object in a charged particle beam system is carried out to accelerate the physical processes which can be observed, for example by means of a particle optical system. For thin-film studies, such as electromigration studies, it is usually desirable to influence or measure a current or voltage in the object from the outside at high temperatures; this is not feasible in the known object holder.

SUMMARY OF THE INVENTION

It is inter alia an object of the invention to provide an object holder which is suitable for observing or influencing electrical states of an object in a charged particle beam system while applying heat.

To achieve this, an object holder in accordance with the invention is characterized in that it also comprises an object carrier which cooperates with the heating element and which comprises an electrically insulating member having a supporting face and an aperture which extends as far as the supporting face and which serves to transmit a charged particle beam, at least two current-conductive contact portions being connected to said insulating member, said contact portions contacting the object when the object is placed on the supporting face.

When an object on the supporting face is made to contact the contact portions, a current can be passed through the object, via the contact portions, and a voltage across the object can be measured at a high temperature. The high temperature accelerates physical processes, so that the duration of the examination is reduced.

A preferred embodiment of an object holder in accordance with the invention is characterized in that the insulating member comprises two sub-members, each of which comprises a contact face, the contact portions being clamped between said contact faces.

When the contact portions are clamped between the contact faces, they are accurately positioned with respect to the insulating member. This simplifies the connection of the comparatively small contact portions to the insulating member which has a diameter of, for example 3 mm.

An embodiment of an object holder in accordance with the invention is characterized in that the contact faces extend transversely of the supporting face.

When the contact portions are clamped between a first sub-member and a second sub-member which is enclosed by the first sub-member, positioning of the contact portions is facilitated.

A further embodiment of an object holder in accordance with the invention is characterized in that the contact faces extend substantially parallel to the supporting face.

A simple object carrier construction is achieved when the contact portions are clamped between two, for example annular sub-members.

Another embodiment of an object holder in accordance with the invention is characterized in that four contact portions are connected to the member, said contact portions being arranged at an angular distance of substantially 90° from one another.

Because the member is provided with four contact portions which are pair-wise oppositely situated, a first pair of contact portions can be used to apply or measure a voltage across the object, the second pair of contact portions being used to apply or measure a current through the object.

A further embodiment of an object holder in accordance with the invention is characterized in that the contact portions contain molybdenum.

Because of its thermal resistance and resilience, molybdenum is particularly suitable for use in contact portions in an object holder in accordance with the invention. The insulating member preferably contains a ceramic material whereto the contact portions are secured, for example by gluing. Glue is also to be understood to include the so-called fusion ceramic where the glue is formed by a powdery mixture containing components such as $SiO_2$, $Al_2O_3$ and $MnO_2$. After having been heated to its a melting point, this powder assumes a fixed structure upon cooling, which structure is capable of resisting temperatures as high as approximately 850° C.

A preferred embodiment of an object holder in accordance with the invention is characterized in that the heating element comprises a container provided with an aperture for transmitting the charged particle beam and also provided with an internal supporting rim, the object carrier being situated in the container while being supported by the supporting rim.

Using such a construction, a heating object holder can be simply made suitable for examination of the electrical behaviour of an object by placing the member with the contact portions in the container.

BRIEF DESCRIPTION OF THE DRAWINGS

Some embodiments of an object holder in accordance with the invention will be described in detail hereinafter with reference to the accompanying drawing. Therein.

DETAILED DESCRIPTION OF PREFERRED EMBODIMENTS

Figure 1:
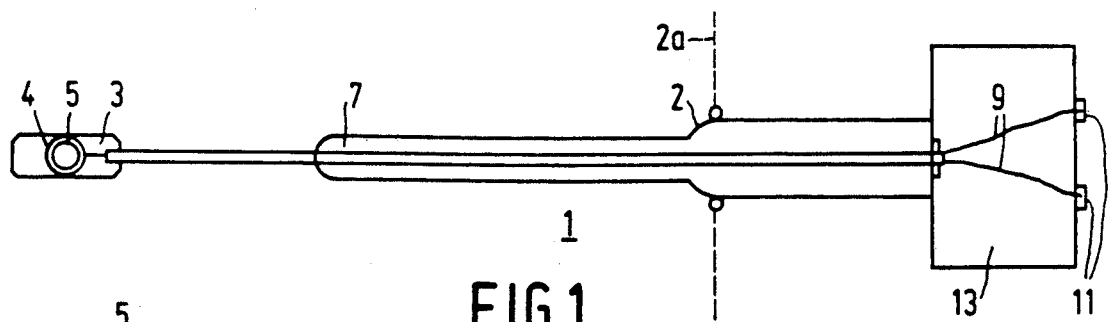
FIG. 1 is a plan view of an object holder with an object carrier in accordance with the invention.
Figure 2:
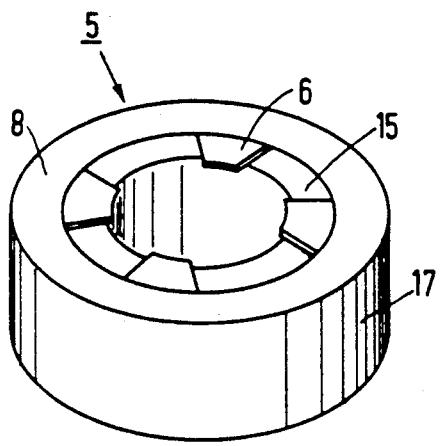
FIG. 2 shows an embodiment of an object carrier in accordance with the invention.

FIG. 1 shows an object holder 1 for use in a transmission electron microscope, for example a type Philips EM 400. The object holder 1 enters a vacuum space of the electron microscope via a wall 2a, denoted by a broken line, and is movably connected to the wall 2a by way of a spherical bearing 2. An object carrier 5 can be introduced into the electron microscope via the object holder 1. In the vacuum space the object holder is rotatable about a longitudinal symmetry axis and can be tilted in a plane of drawing in order to position an object supported by the object holder in the electron microscope. A tip 3 of the object holder comprises a heating element 4 and the object carrier 5 arranged therein. The object carrier 5 comprises a cylindrical insulating member which is provided with, for example four current-conductive contact portions 6 as shown in FIG. 2. A member 7 of the object holder 1 is traversed by electrical leads 9 which are connected to a contact portion 6 on the one side and to a connection socket 11 on the other side. The leads for powering the heating element 4 also extend through the member 7. The connection sockets 11 are situated in a portion 13 of the object holder 1 which is situated outside the vacuum space of the electron microscope. A current or voltage source or meter can be connected to the connection sockets 11.

Figure 3:
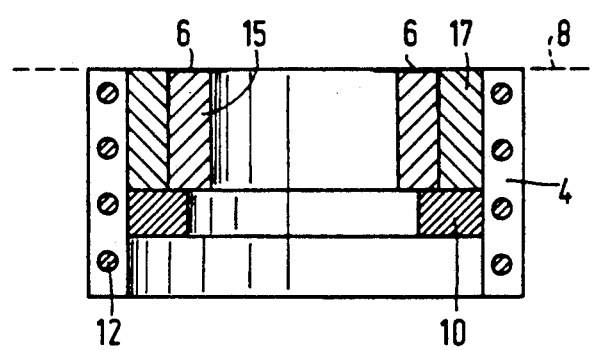
FIG. 3 is a lateral sectional view of the object carrier in the embodiment shown in FIG. 2, surrounded by a heating element.

FIG. 2 shows the object carrier 5 with a supporting face 8 on which an object to be examined can be arranged. The contact portions 6 in the form of metal lugs are secured, for example by gluing, between two coaxial hollow cylindrical sub-members 15 and 17. The contact portions 6 are positioned by clamping between the contact faces of the sub-members 15 and 17. In the described embodiment, the contact faces are formed by a surface of envelope of the cylindrical sub-members 15 and 17, which surfaces of envelope extend transversely of the supporting face 8. FIG. 3 is a cross-sectional view of the heating element 4 in which the object carrier 5 is supported by an internal supporting rim 10. The heating element 4 comprises a tungsten filament 12 for heating an object to be arranged on the object carrier.

Figure 4A:
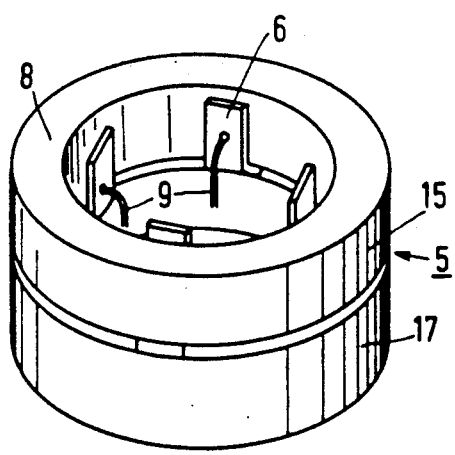
FIGS. 4a and 4b are a front view and a lateral sectional view, respectively, of a further embodiment of an object carrier in accordance with the invention.
Figure 4B:
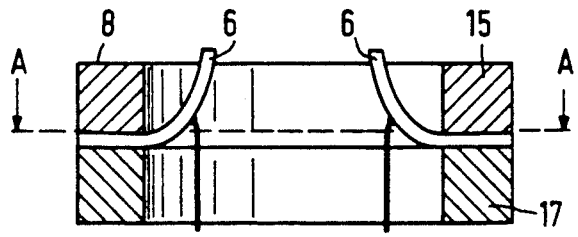

FIGS. 4a and 4b show an embodiment of the object carrier 5 in which the contact faces of the sub-members 15 and 17 extend substantially parallel to the supporting face 8. The contact portions 6 are clamped between the flat sides of the two annular sub-members 15 and 17. The contact portions 6 are cut, for example by means of a laser, from a plate of molybdenum, the portions remaining interconnected at the centre of the plate. Subsequently, the interconnected contact portions are clamped and secured between the annular sub-members 15 and 17. Subsequently, the centre of the molybdenum plate is cut out and four, accurately positioned, separate contact portions are formed. The contact portions are bent until they extend slightly beyond the supporting face 8, so that they yield and make suitable contact with the object when an object is positioned on the supporting face. Leads 9 are connected to the contact portions 6 spot soldering, by spot welding or by means of laser-beam welding.

Figure 5:
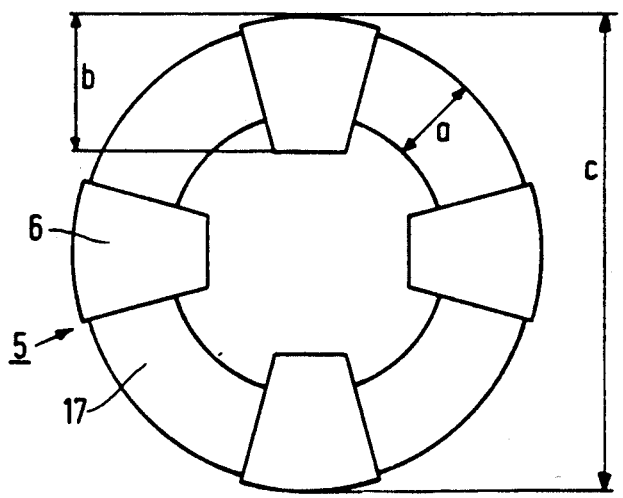
FIG. 5 is a sectional view of the embodiment of the object carrier shown in FIGS. 4a and 4b.

FIG. 5 is a sectional view of the object carrier 5, taken along the line A—A in FIG. 4b. A diameter c of the object carrier amounts to, for example 3 mm; a width a of the sub-members 15 and 17 amounts to, for example 0.5 mm; and a dimension b of the contact portions 6 amounts to, for example 1 mm. For symmetrical conduction of heat the object carrier has a cylindrical construction. However, the invention is not restricted to a cylindrical geometry but also covers polygonal embodiments of object carriers.

I claim:

1. An object holder which serves to support an object in a charged particle beam system and which comprises a heating element, an object carrier which cooperates with the heating element and an electrically insulating member having a supporting face and an aperture which extends as far as the supporting face and which serves to transmit a charged particle beam, wherein the improvement comprises that at least two current-conductive contact portions are connected to said insulating member, and that the insulating member comprises two sub-members, each of which comprises a contact face, the contact portions being clamped between said contact faces.

2. An object holder as claimed in claim 1, wherein the contact faces extend transversely of the supporting face.

3. An object holder as claimed in claim 1, wherein the contact faces extend substantially parallel to the supporting face.

4. An object holder as claimed in claim 1, wherein the contact portions contain molybdenum.

5. An object holder as claimed in claim 1, wherein the insulating member contains a ceramic material, the contact portions being secured to said insulating member by way of fusion ceramic.

6. An object holder as claimed in claim 1, wherein the heating element comprises a container provided with an aperture for transmitting the charged particle beam and also provided with an internal supporting rim, the object carrier being situated in the container while being supported by the supporting rim.

* * * * *